(12) United States Patent
Gong et al.

(10) Patent No.: US 9,570,387 B1
(45) Date of Patent: Feb. 14, 2017

(54) THREE-DIMENSIONAL INTEGRATED CIRCUIT SYSTEMS IN A PACKAGE AND METHODS THEREFOR

(71) Applicant: FREESCALE SEMICONDUCTOR, INC., Austin, TX (US)

(72) Inventors: Zhiwei Gong, Chandler, AZ (US); Scott M. Hayes, Chandler, AZ (US); Michael B. Vincent, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/829,820

(22) Filed: Aug. 19, 2015

(51) Int. Cl.
| H01L 23/48 | (2006.01) |
| H01L 23/495 | (2006.01) |
| H01L 21/00 | (2006.01) |
| H01L 23/498 | (2006.01) |
| H01L 21/48 | (2006.01) |

(52) U.S. Cl.
CPC ....... H01L 23/49894 (2013.01); H01L 21/486 (2013.01); H01L 21/4853 (2013.01); H01L 23/49816 (2013.01); H01L 23/49827 (2013.01)

(58) Field of Classification Search
CPC .................. H01L 23/49894; H01L 23/49816; H01L 23/50; H01L 22/16055; H01L 23/49827
USPC ..... 257/738, 773, 669, 762, E21.5, E21.508, 257/780, E29.323, 678, 777, 774; 438/109, 125, 438/64, 464
See application file for complete search history.

(56) References Cited

U.S. PATENT DOCUMENTS

| 7,078,788 B2 | 7/2006 | Vu et al. | |
| 7,579,690 B2 | 8/2009 | Chia | |
| 8,216,918 B2 | 7/2012 | Gong et al. | |
| 8,829,661 B2 | 9/2014 | Lytle et al. | |
| 2006/0001145 A1* | 1/2006 | Ho | H01L 23/13 257/690 |
| 2007/0111398 A1 | 5/2007 | Hsu | |
| 2007/0227765 A1* | 10/2007 | Sakamoto | H01L 21/4846 174/260 |
| 2008/0186690 A1 | 8/2008 | Miettinen et al. | |
| 2009/0224391 A1* | 9/2009 | Lin | H01L 21/6835 257/690 |
| 2009/0321915 A1* | 12/2009 | Hu | H01L 23/5389 257/690 |
| 2012/0021565 A1* | 1/2012 | Gong | H01L 21/6835 438/121 |
| 2012/0126388 A1* | 5/2012 | Lin | H01L 21/56 257/690 |

* cited by examiner

*Primary Examiner* — Dzung Tran

(57) ABSTRACT

A method for making a packaged semiconductor device includes dispensing a first adhesive into a first cavity of a substrate having a first major surface and a second major surface. The first cavity extends into the substrate from the second major surface. The method further includes placing a first component having a thickness less than a thickness of the substrate into the first cavity such that the first adhesive physically contacts a first major surface of the first component and at least partially fills a gap between sidewalls of the first component and sidewalls of the first cavity. After placing the first component, a second major surface of the first component is coplanar with the second major surface of the substrate.

12 Claims, 6 Drawing Sheets

THREE-DIMENSIONAL INTEGRATED CIRCUIT SYSTEMS IN A PACKAGE AND METHODS THEREFOR

BACKGROUND

Field

This disclosure relates generally to semiconductor devices, and more specifically, to stacked integrated circuit systems in a package, and methods therefor.

Related Art

Three-dimensional integrated circuit (ICs) systems in package (SiP) may comprise a number of package layers stacked one upon another with inter-package connection comprising through-vias. Three-dimensional IC SiP packaging technologies usually have lengthy process. For example, a three-dimensional fan-out wafer level package requires panels containing one or more components to be joined together, through-package vias to be formed, and build-up layers to be formed. In addition, components on different layers of the package can have different heights or thicknesses. The complex processes required to form SiPs can present manufacturing challenges, increased cost, and reliability issues. It is therefore desirable to develop three-dimensional packaging technology with reduced process complexity to improve manufacturability, and reduce cost and cycle time.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods disclosed herein include embedding die and other components in cavities in a prefabricated substrate. Vias are formed through the substrate to allow components to be connected on either side of the substrate. The "bottom side" of the substrate has routing layers which can act as a "metal 0" layer in the package. The "top side" of the substrate has solder mask openings to receive one or more packages or surface mount devices. The components to be placed in the cavities can have different thicknesses, which would ordinarily complicate manufacturing due to the resulting uneven surface. To solve this problem, the variation in thickness is compensated by using epoxy to hold the die and components in the cavity and create an even surface at the top surface of the substrate by embedding the components at different depths in the cavities. A relatively high viscosity epoxy can be used to make sure the die and component stay in the place after placement. An oversized nozzle on an automated component placement system, also referred to as a pick & place machine or other suitable technique, can be used to make sure the components are placed coplanar to the top surface of substrate. Additional epoxy can be dispensed to fill the gap between the components and substrate. The interconnect layer is built-up and a ball grid array is formed after the epoxy is cured. The product can be processed in a large panel form then singulated into single packages. Package on package and surface mount devices can be assembled after singulation or during printed circuit board assembly.

Figure 1:
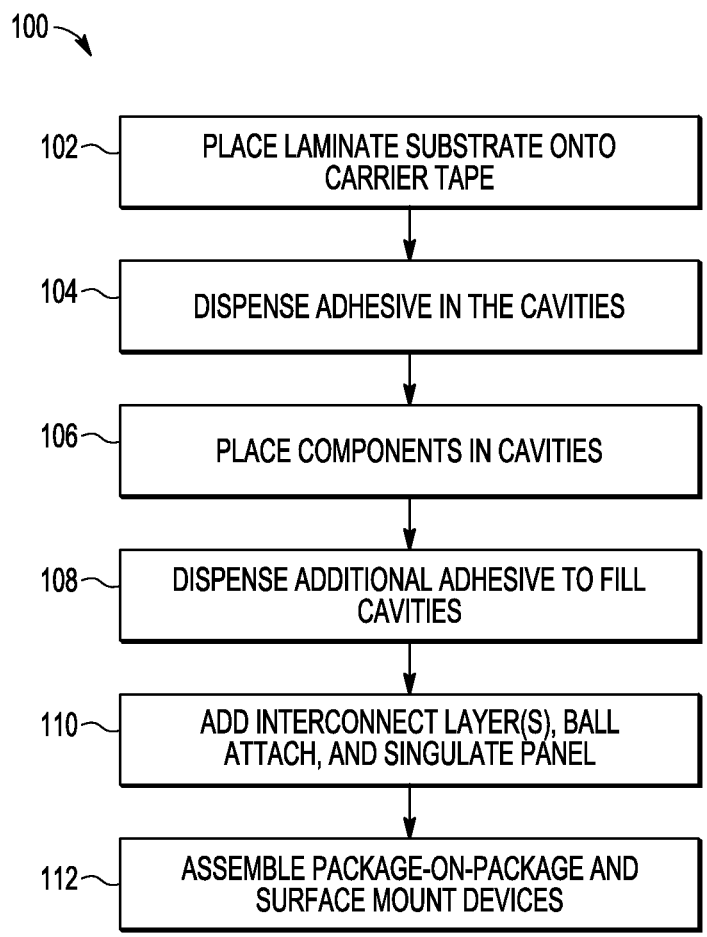
FIG. 1 is a flow diagram of an embodiment of a method for manufacturing a three-dimensional system in a package (SiP).
Figure 2:
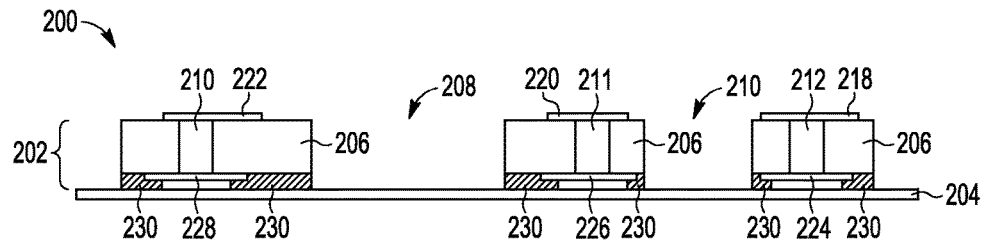
FIGS. 2-7 illustrate a cross-sectional view of an embodiment of a three-dimensional package during successive stages of manufacture according to the method of FIG. 1.

FIG. 1 is a flow diagram of an embodiment of a method 100 for manufacturing a three-dimensional system in a package (SiP). Method 100 is described with reference to FIGS. 2-7, which illustrate a three-dimensional SiP 200 in various stages of manufacture according to the method of FIG. 1. Referring to FIGS. 1 and 2, process 102 of method 100 includes placing a laminated substrate 202 onto an adhesive carrier tape 204 to hold substrate in place during subsequent manufacturing. Substrate 202 can be also made by other technology or materials, for instance monolithic substrate is made of organic or inorganic (i.e. ceramic, glass, silicon or metal). Tape 204 is not permanently attached and will typically be removed during a subsequent stage of manufacturing.

With one embodiment, substrate 202 can be a laminate substrate that includes an electrically non-conductive portion 206 with one of more cavities 208, 210 of the same or different sizes. Cavities 208, 210 typically extend completely through non-conductive portion 206 from a first or top major surface of substrate 202 to a second or bottom major surface of substrate 202. Cavities 208, 210 can extend only partially through substrate 202 in other implementations. Multiple electrically conductive through hole vias (THVs) 210, 211, 212 can be formed in non-conductive portion 206 by mechanical or laser drill followed by metallization processes, e.g. copper plating and connected between respective electrically conductive routing traces 218, 220, 222 on the upper major surface of non-conductive portion 206 and contact pads 224, 226, 228 on the bottom major surface of non-conductive portion 206. The bottom major surface layer may include routing traces as well.

Solder mask 230 is formed on the bottom major surface to leave openings around contact pads 224. Solder mask is shown directly adjacent and in contact with tape 204 to retain substrate 202 and close one side of cavities 208, 210 while the other side of cavities 208, 210 are open at the top major surface of substrate 202. In some embodiments, solder mask can be formed on the top major surface (not shown).

Figure 3:
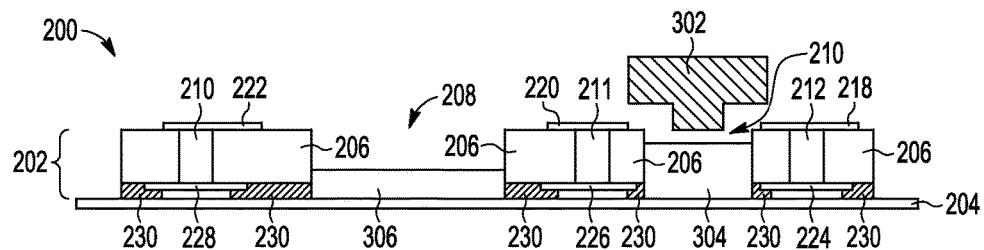

Referring to FIGS. 1 and 3, FIG. 3 illustrates a cross-sectional view of an embodiment of a three-dimensional package 200 during a subsequent stage of manufacture according to process 104 of method 100 of FIG. 1. Process 104 includes dispensing an adhesive 304, 306 such as epoxy or other suitable adhesive through dispenser 302 into cavities 208, 210. The volume of a component to be placed in a particular cavity 208, 210 added to the volume of adhesive 304, 306 dispensed in a respective cavity 208, 210 is generally less than the total volume of cavity 208, 210. Adhesive 304, 306 has a viscosity that is high enough to prevent a component from sinking further into the cavity after being placed in the cavity. Examples of adhesives suitable for use as adhesive 304, 306 are glob top dam epoxy, commercially available from several manufacturers. The material can consist of an epoxy resin, anhydride hardener, silica filler particles, and rheological agents. The material's viscosity during the dispense process may be less than 1,000 Pascal-second (Pa-s) and after the dispense process may be greater than 1,000 Pa-s. Depending on the material system used, the viscosities may be lower and provide the same effect. For example, the viscosity during dispense may be less than 500 Pa-s and after dispense may be greater than 500 Pa-s. Dispenser 302 can be operated manually or by automated equipment programmed to dispense a desired amount of adhesive 304, 306 in each cavity 208, 210. Note that the volume of each cavity 208, 210 may be different, or two or more cavities 208, 210 may have the same volume that is different from the volume of one or more other cavities 208, 210.

Figure 4:
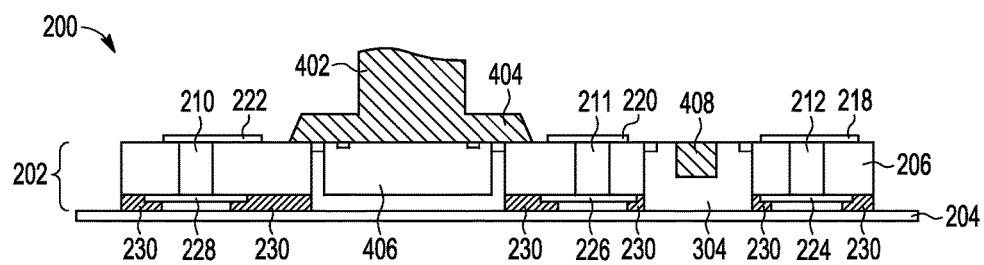

Referring to FIGS. 1 and 4, FIG. 4 illustrates a cross-sectional view of an embodiment of a three-dimensional package 200 during a subsequent stage of manufacture according to process 106 of method 100 of FIG. 1. Process 106 includes placing components 406, 408 such as integrated circuit die for processing logic, memory, and/or other digital and analog circuitry, discrete components such as resistors, capacitors, and inductors, as well as discrete semiconductor devices such as transistors and diodes. Components 406, 408 can be placed using an automated component placement system (also referred to as a "pick and place machine") with a nozzle 402 that is configured to grasp a component 406, 408 from a holding area, and release the component 406, 408 in a specified cavity 208, 210 (FIG. 3) where adhesive 306, 304 has already been deposited.

Nozzle 402 can have side extensions 404 that are wider than cavities 208, 210. As nozzle 402 is lowered, side extensions 404 prevent the top surface of components 406, 408 from being placed lower than the surrounding top surface of substrate 202, since side extensions 404 meet the top surface of substrate 202. The top surface of components 406, 408 are typically held against the bottom surface of nozzle 402 with a vacuum force during movement and placement. Once placed, the vacuum is removed and components 406, 408 remain in place due to the relatively high viscosity of adhesive 304, 306. Once adhesive 304, 306 cures, components 406, 408 are immovably positioned so that the upper surface of substrate 202 remains even with the upper surface of components 406, 408 to create a flat surface on which the interconnection layers can be formed using various known technologies, e.g. build up or lamination processes.

Figure 5:
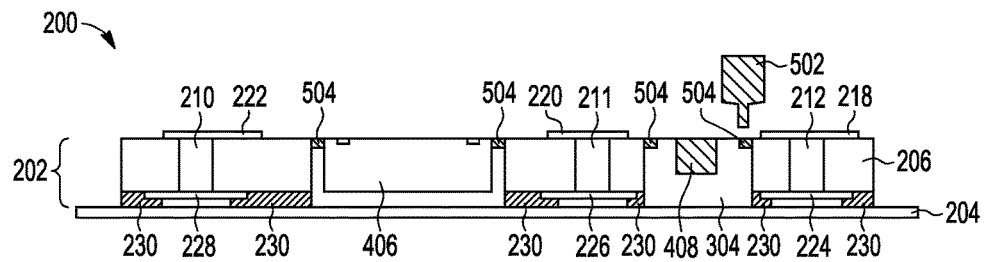

Referring to FIGS. 1 and 5, FIG. 5 illustrates a cross-sectional view of an embodiment of package 200 during a subsequent stage of manufacture according to process 108 of method 100 of FIG. 1. Process 108 includes using dispenser 502 to dispense additional adhesive 504 on top of adhesive 304, 306 to fill any gap in cavities 208, 210 between the top of adhesive 304, 306 and the top surface of substrate 202 and components 406, 408. Additional adhesive 504 can be lower viscosity than adhesive 304, 306. The viscosity during dispense may be less than 100 Pa-s. The height of additional adhesive 504 is approximately is sufficient to maintain a relatively flat surface among substrate 202, components 406, 408. In an alternative embodiment, the adhesive 504 may not be necessary. The gap in cavities 208, 210 between the top of adhesive 304, 306 and the top surface of substrate 202 and components 406, 408 can be subsequently filled with dielectric material 602.

Figure 6:
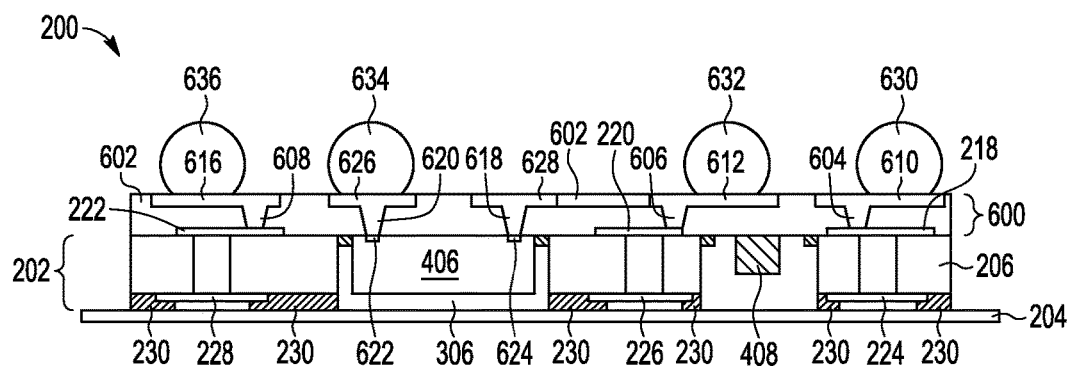

Referring to FIGS. 1 and 6, FIG. 6 illustrates a cross-sectional view of an embodiment of package 200 during a subsequent stage of manufacture according to process 110 of method 100 of FIG. 1. Once additional adhesive 504 cures, process 110 includes forming interconnect layer 600 over the top of substrate 202, components 406, 408, and adhesive 504. Even though components 406, 408 have different thicknesses, the level surface of package 200 that results from embedding components at different levels in viscous adhesive 304, 306 allows interconnect layer 600 to be formed using standard processes, alleviating problems associated with having components 406, 408 at different heights.

Interconnect layer 600 can include one or more layers of dielectric material 602 with vias 604, 606, 608 filled with conductive material between contacts 610, 612, 616 on the upper surface of interconnect layer 600 and contacts 218, 220, 222 on the upper surface of substrate 202. Additional vias 618, 620 can be formed between contacts 622, 624 on component 406 and contacts 626, 628 on the top surface of interconnect layer 600. Although not shown, other interconnects including vias and contacts can be included for component 408 as well as other components in a package and contacts on substrate 202. Additional layers of dielectric material with vias formed between contacts can also be included as part of package 200. A solder mask layer (not shown) can be formed over contacts 610, 612, 616, 626 to define solder ball contact area. The interconnection layer 600 can be formed using various known technologies e.g. build up or lamination processes.

Once interconnect layer 600 is formed, solder balls 630, 632, 634, 636 can be formed on respective contacts 610, 612, 626, 636 to allow package to be attached to another substrate such as a printed circuit board or other suitable device. After solder balls 630-636 are formed, package 200 can be singulated to separate package 200 from other packages (not shown) that can include similar or different components as package 200. Tape 204 can be removed before or after package 200 is singulated.

Figure 7:
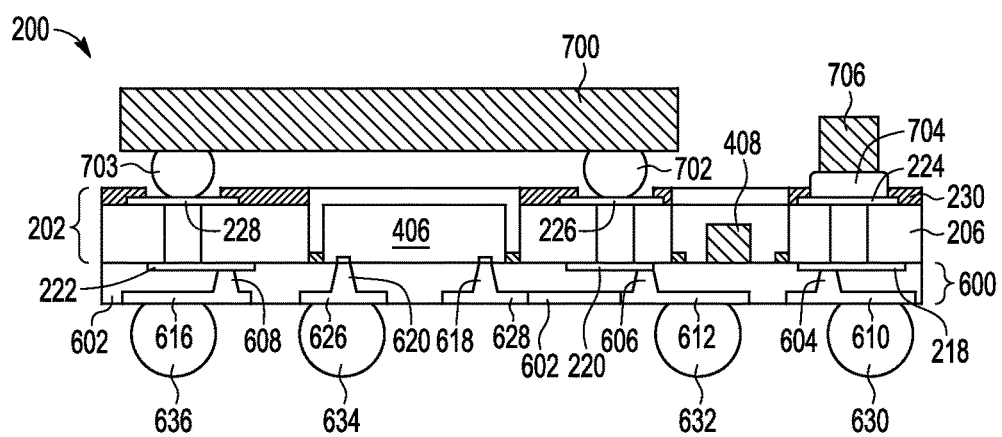

Referring to FIGS. 1 and 7, FIG. 7 illustrates a cross-sectional view of an embodiment of three-dimensional package 200 during a subsequent stage of manufacture according to process 112 of method 100 of FIG. 1. Process 112 includes adding package 700 and surface mount device (SMD) 706 to package 200. Package 700 is attached to contacts 228, 226 with solder balls 702, 703. SMD 706 is attached to contact 224 with solder 704. In other embodiments, additional packages and components can be added to package 200, whether being attached to contacts on package 200, or contacts (not shown) on package 700.

Figure 8:
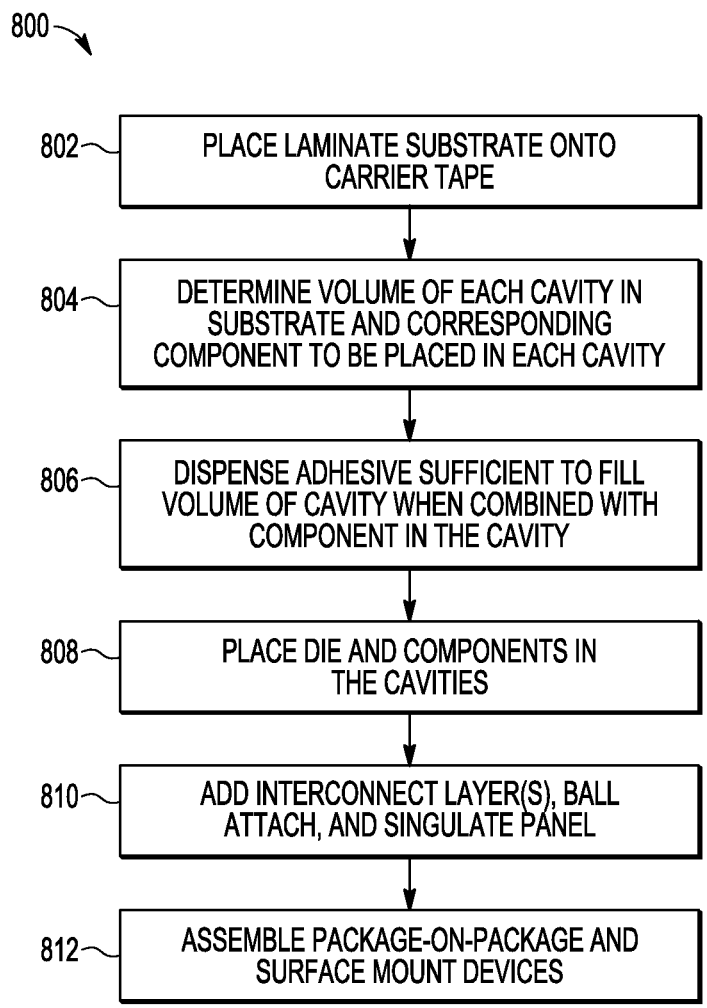
FIG. 8 is a flow diagram of another embodiment of a method for manufacturing a three-dimensional system in a package (SiP).
Figure 9:
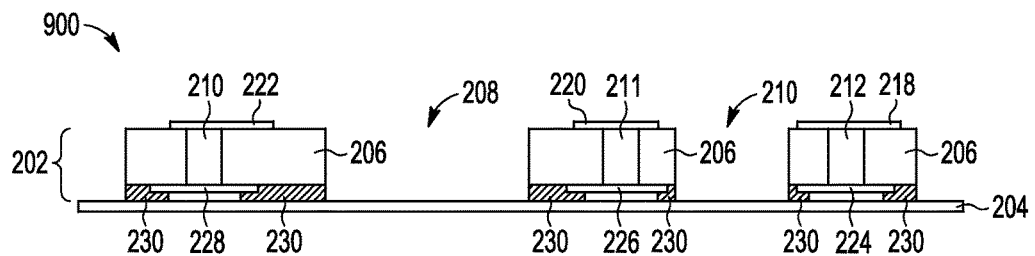
FIGS. 9-13 illustrate a cross-sectional view of an embodiment of a three-dimensional package during successive stages of manufacture according to the method of FIG. 8.

FIG. 8 is a flow diagram of another embodiment of a method 800 for manufacturing a three-dimensional system in a package (SiP). Method 800 is described with reference to FIGS. 9-13, which illustrate a three-dimensional SiP 900 in various stages of manufacture according to the method of FIG. 8. Referring to FIGS. 8 and 9, process 802 of method 800 includes placing a substrate 202 onto an adhesive carrier tape 204 to hold substrate in place during subsequent manufacturing. Substrate 202 can be also made by other technology or materials, for instance monolithic substrate is made of organic or inorganic (i.e. ceramic, glass, silicon or metal). Tape 204 is not permanently attached and will typically be removed during a subsequent stage of manufacturing.

With one embodiment, substrate 202 can be a laminate substrate that includes an electrically non-conductive portion 206 with one of more cavities 208, 210 of the same or different sizes. Cavities 208, 210 typically extend completely through non-conductive portion 206 from a first or top major surface of substrate 202 to a second or bottom major surface of substrate 202. Cavities 208, 210 can extend only partially through substrate 202 in other implementations. Multiple electrically conductive through hole vias (THVs) 210, 211, 212 can be formed in non-conductive portion 206 by mechanical or laser drill followed by metallization processes, e.g. copper plating, and connected between respective electrically conductive routing traces 218, 220, 222 on the upper major surface of non-conductive portion 206 and contact pads 224, 226, 228 on the bottom major surface of non-conductive portion 206. The bottom major surface layer may include routing traces as well.

Solder mask 230 is formed on the bottom major surface to leave openings around contact pads 224. Solder mask is shown directly adjacent and in contact with tape 204 to retain substrate 202 and close one side of cavities 208, 210 while the other side of cavities 208, 210 are open at the top major surface of substrate 202. In some embodiments, solder mask can be formed on the top major surface (not shown).

Referring to FIG. 8, process 804 of method 800 includes determining the volume of cavities 208, 210. Process 804 can be performed by a controller in an automated component placement machine (not shown) that includes or has access to information regarding the volume or information such as height, width, and length to calculate the volume of cavities 208, 210, as well as the volume or height, width, and length of components to placed in respective cavities 208, 210. The volume of cavities 208, 210 less the volume of a respective component to be placed in the cavity 208, 210 is the volume of adhesive to be dispensed in a respective cavity 208, 210.

Figure 10:
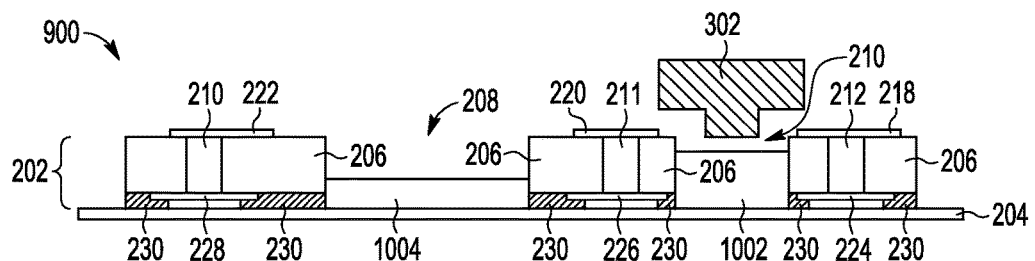

Referring to FIGS. 8 and 10, FIG. 10 illustrates a cross-sectional view of an embodiment of a three-dimensional package 900 during a subsequent stage of manufacture according to process 806 of method 800 of FIG. 8. Process 806 includes dispensing an adhesive 1002, 1004 such as epoxy or other suitable adhesive through dispenser 302 into cavities 208, 210. The volume of a component to be placed in a particular cavity 208, 210 added to the volume of adhesive 1002, 1004 dispensed in a respective cavity 208, 210 is ideally the same as the total volume of cavity 208, 210. Adhesive 1002, 1004 has a viscosity that is high enough to prevent a component from sinking further into the cavity 208, 210 after being placed in the cavity 208, 210. Examples of adhesives suitable for use as adhesive 304, 306 is glob top dam epoxy that is commercially available from several manufacturers. The material can consist of an epoxy resin, anhydride hardener, silica filler particles, and rheological agents. The material's viscosity during the dispense process may be less than 1,000 Pascal-second (Pa-s) and after the dispense process may be greater than 1,000 Pa-s. Depending on the material system used, the viscosities may be lower and provide the same effect. For example, the viscosity during dispense may be less than 500 Pa-s and after dispense may be greater than 500 Pa-s. Other suitable material may be used. Dispenser 302 can be operated manually or by automated equipment programmed to dispense a predetermined amount of adhesive 1002, 1004 in each cavity 208, 210. Note that the volume of each cavity 208, 210 may be different, or two or more cavities 208, 210 may have the same volume that is different from the volume of one or more other cavities 208, 210.

Figure 11:
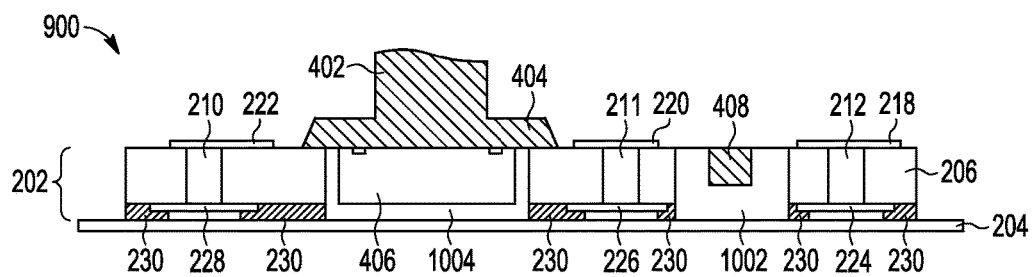

Referring to FIGS. 8 and 11, FIG. 11 illustrates a cross-sectional view of an embodiment of a three-dimensional package 900 during a subsequent stage of manufacture according to process 808 of method 800 of FIG. 8. Process 808 includes placing components 406, 408 such as integrated circuit die for processing logic, memory, and/or other digital and analog circuitry, discrete components such as resistors, capacitors, and inductors, as well as discrete semiconductor devices such as transistors and diodes. Components 406, 408 can be placed using an automated component placement system (also referred to as a "pick and place" machine) with a nozzle 402 that is configured to grasp a component 406, 408 from a holding area, and release the component 406, 408 in a specified cavity 208, 210 (FIG. 10) where adhesive 1004, 1002 has already been deposited.

Nozzle 402 can have side extensions 404 that are wider than cavities 208, 210. As nozzle 402 is lowered, side extensions 404 prevent the top surface of components 406, 408 from being placed lower than the surrounding top surface of substrate 202, since side extensions 404 meet the top surface of substrate 202. The top surface of components 406, 408 are typically held against the bottom surface of nozzle 402 with a vacuum force during movement and placement. Once placed, the vacuum is removed and components 406, 408 remain in place due to the relatively high viscosity of adhesive 1002, 1004. Once adhesive 1002, 1004 cures, components 406, 408 are immovably positioned so that the upper surface of substrate 202 remains even with the upper surface of components 406, 408 to create a flat surface on which the interconnection layers can be formed using various known technologies, e.g. build up or lamination processes.

Figure 12:
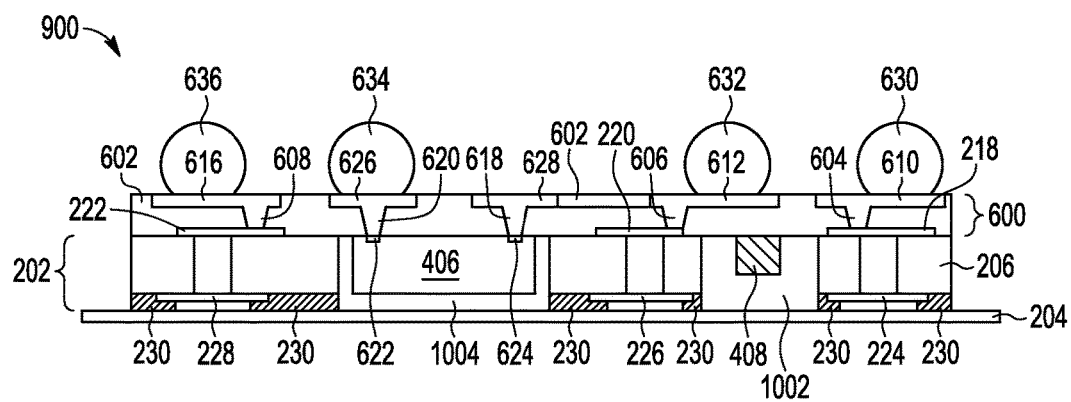

Referring to FIGS. 8 and 12, FIG. 12 illustrates a cross-sectional view of an embodiment of package 900 during a subsequent stage of manufacture according to process 810 of method 800 of FIG. 8. Once additional adhesive 504 cures, process 810 includes forming interconnect layer 600 over the top of substrate 202, components 406, 408, and adhesive 504. Even though components 406, 408 have different thicknesses, the level surface of package 900 that results from embedding components at different levels in viscous adhesive 1002, 1004 allows interconnect layer 600 to be formed using standard processes, alleviating problems associated with having components 406, 408 at different heights.

Interconnect layer 600 can include one or more layers of dielectric material 602 with vias 604, 606, 608 filled with conductive material between contacts 610, 612, 616 on the upper surface of interconnect layer 600 and contacts 218, 220, 222 on the upper surface of substrate 202. Additional vias 618, 620 can be formed between contacts 622, 624 on component 406 and contacts 626, 628 on the top surface of interconnect layer 600. Although not shown, other interconnects including vias and contacts can be included for component 408 as well as other components in a package and contacts on substrate 202. Additional layers of dielectric material with vias formed between contacts can also be included as part of package 900. A solder mask layer (not shown) can be formed over contacts 610, 612, 616, 626 to define solder ball contact area. The interconnection layer 600 can be formed using various known technologies e.g. build up or lamination processes.

Once interconnect layer 600 is formed, solder balls 630, 632, 634, 636 can be formed on respective contacts 610, 612, 626, 636 to allow package to be attached to another substrate such as a printed circuit board or other suitable device. After solder balls 630-636 are formed, package 900 can be singulated to separate package 900 from other packages (not shown) that can include similar or different components as package 900. Tape 204 can be removed before or after package 900 is singulated.

Figure 13:
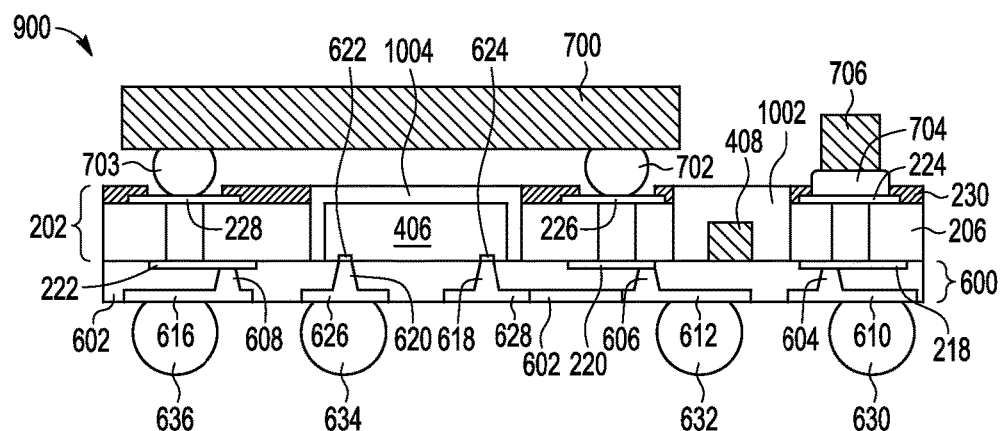

Referring to FIGS. 1 and 13, FIG. 13 illustrates a cross-sectional view of an embodiment of three-dimensional package 900 during a subsequent stage of manufacture according to process 812 of method 800 of FIG. 8. Process 812 includes adding package 700 and surface mount device (SMD) 706 to package 900. Package 700 is attached to contacts 228, 226 with solder balls 702, 703. SMD 706 is attached to contact 224 with solder 704. In other embodiments, additional packages and components can be added to package 900, whether being attached to contacts on package 900, or contacts (not shown) on package 700.

By now it should be appreciated that packages 200, 900, and methods 100, 800 have been disclosed that use automated component placement equipment such as a pick and place machine and viscous adhesive in cavities of substrate 202 to manufacture three-dimensional systems in package. Components 406, 408 can have different thicknesses but are positioned so that the top surface of each component 406, 408 is coplanar with the top surface of substrate 202 to simplify subsequent buildup of interconnect layer 600. An active side of a die used for component 406 in the embodiments disclosed is placed face up in cavity 208, which also simplifies connecting contacts 622, 624 on component 406 to interconnect layer 600. In addition, no chemical-mechanical polishing or planarizing process is required to achieve a level or planar surface at the top of substrate 200, as shown in FIGS. 6 and 12.

In some embodiments, a method for making a packaged semiconductor device (200, 900) includes dispensing a first adhesive (306, 304, 1002, or 1004) into a first cavity (208 or 210) of a substrate (202) having a first major surface and a second major surface. The first cavity extends into the substrate from the second major surface. The method further includes placing a first component (406 or 408) having a thickness less than a thickness of the substrate into the first cavity such that the first adhesive physically contacts a first major surface of the first component and at least partially fills a gap between sidewalls of the first component and sidewalls of the first cavity. After placing the first component, a second major surface of the first component is coplanar with the second major surface of the substrate.

In another aspect, the method can further comprise, after placing the first component into the first cavity, dispensing a second adhesive (504) over the first adhesive to fill a remaining gap between the sidewalls of the first component and the sidewalls of the first cavity such that a surface of the second adhesive is coplanar with the second major surface of the substrate.

In another aspect, placing the first component is performed using a pick and place tool (402, 404).

In another aspect, placing the first component can comprise: using a nozzle (404) of the pick and place tool to grasp the first component; and lowering the nozzle to place the first component into the first cavity, wherein the nozzle prevents the second major surface of the first component being placed lower than the second major surface of the substrate.

In another aspect, the method can further comprise, prior to dispensing the first adhesive into the first cavity, placing the first major surface of the substrate onto a carrier (204).

In another aspect, the first cavity can extend from the second major surface of the substrate to the first major surface of the substrate.

In another aspect, the substrate can include through substrate vias (216) which extend from the second major surface to the first major surface of the substrate.

In another aspect, dispensing the first adhesive can comprise dispensing the first adhesive into a second cavity (210) of the substrate, and the method can further comprise placing a second component (408) having a thickness less than the thickness of the substrate into the second cavity such that the first adhesive physically contacts a first major surface of the second component and at least partially fills a gap between sidewalls of the second component and sidewalls of the second cavity, wherein, after placing the second component, a second major surface of the second component is coplanar with the second major surface of the first component and the second major surface of the substrate.

In another aspect, the method can further comprise, after placing the first and second components, dispensing a second adhesive (504) over the first adhesive in the first cavity to fill a remaining gap between the sidewalls of the first component and the sidewalls of the first cavity and over the first adhesive in the second cavity to fill a remaining gap between the sidewalls of the second component and the sidewalls of the second cavity such that a surface of the second adhesive in the first and second cavities is coplanar with the second major surface of the substrate.

In another aspect, the thickness of the first component can be different from the thickness of the second component.

In another aspect, an active surface of the first component can be at the second major surface of the first component, the method can further comprise forming an interconnect layer (600) on the second major surface of the substrate and second major surface of the first component.

In another aspect, the method can further comprise singulating (110, 810) the substrate to form a singulated package having the first component; and attaching a semiconductor device to the first major surface of the substrate of the singulated package, wherein the semiconductor device is one of a packaged device (700) or a surface mount device (706).

In other embodiments, a method for making a packaged semiconductor device, can comprise dispensing a first adhesive (306) into a first cavity (208) and a second cavity (210) of a substrate (202) having a first major surface and a second major surface. The first and second cavity can each extend into the substrate from the second major surface of the substrate. A first component (406) having a thickness less than a thickness of the substrate can be placed into the first cavity such that the first adhesive in the first cavity physically contacts a first major surface of the first component and at least partially fills a gap between sidewalls of the first component and sidewalls of the first cavity. After placing the first component, a second major surface of the first component is coplanar with the second major surface of the substrate. A second component (408) having a thickness less than the thickness of the substrate can be placed into the second cavity such that the first adhesive in the second cavity physically contacts a first major surface of the second component and at least partially fills a gap between sidewalls of the second component and sidewalls of the second cavity. After placing the second component, a second major surface of the second component is coplanar with the second major surface of the substrate.

In another aspect, an active surface of the first component can be at the second major surface of the first component and an active surface of the second component is at the second major surface of the second component. The method can further comprise forming an interconnect layer (600) on the second major surface of the substrate, second major surface of the first component, and second major surface of the second component.

In another aspect, the method can further comprise after placing the first component into the first cavity and the second component in the second cavity, dispensing a second adhesive (504) over the first adhesive in the first cavity to fill a remaining gap between the sidewalls of the first component and the sidewalls of the first cavity and over the first adhesive in the second cavity to fill a remaining gap between the sidewalls of the second component and the sidewalls of the second cavity such that a surface of the second adhesive in the first and second cavities is coplanar with the second major surface of the substrate.

In another aspect, the method can further comprise singulating (110, 810) the substrate to form a singulated package having the first and second components; and attaching a semiconductor device to the first major surface of the substrate of the singulated package, wherein the semiconductor device is one of a packaged device or a surface mount device.

In another aspect, placing the first component and placing the second component can be performed using a pick and place tool (402, 404).

In still other embodiments, a system in package can comprise a substrate (202) having a first thickness; a first component (406) in a first cavity of the substrate, the first component having a second thickness less than the first thickness; and a second component (408) in a second cavity of the substrate. The second component can have a third thickness less than the first thickness and different from the second thickness. An active surface of the first component is at a first major surface of the first component. An active surface of the second component is at a first major surface of the second component. The first major surfaces of the first and second components are coplanar with a first major surface of the substrate. An epoxy (306, 504) is on a second major surface of the first component and surrounding sidewalls of the first component in the first cavity and on a second major surface of the second component and surrounding sidewalls of the second component in the second cavity. An interconnect layer (600) is on the first major surfaces of the first component, second component, and substrate.

In another aspect, the system can further comprise a plurality of conductive balls (636) on contacts of the interconnect layer. The interconnect layer is between the conductive balls and the substrate.

In another aspect, the substrate can comprise a conductive through substrate via (216). The system can further comprise a packaged device (700) attached to a second major surface of the substrate and electrically connected to the conductive through substrate via.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a packaged semiconductor device, comprising:
   dispensing adhesive into a the first cavity of the substrate having a first major surface and a second major surface, wherein the first cavity extends into the substrate from the second major surface; and
   placing a first component having a thickness less than a thickness of the substrate into the first cavity such that the adhesive physically contacts a first major surface of the first component and at least partially fills a gap between sidewalls of the first component and sidewalls of the first cavity, wherein, after placing the first component, a second major surface of the first component is coplanar with the second major surface of the substrate immediately after the first component is placed in the first cavity.

2. The method of claim 1, wherein:
   the dispensing adhesive includes, after placing the first component into the first cavity, dispensing additional adhesive over the adhesive to fill a remaining gap between the sidewalls of the first component and the sidewalls of the first cavity such that a surface of the additional adhesive is coplanar with the second major surface of the substrate.

3. The method of claim 1, wherein placing the first component is performed using a pick and place tool.

4. The method of claim 3, wherein placing the first component comprises:
   using a nozzle of the pick and place tool to grasp the first component; and
   lowering the nozzle to place the first component into the first cavity, wherein the nozzle prevents the second major surface of the first component being placed lower than the second major surface of the substrate.

5. The method of claim 1, further comprising:
   prior to dispensing the adhesive into the first cavity, placing the first major surface of the substrate onto a carrier.

6. The method of claim 5, wherein the first cavity extends from the second major surface of the substrate to the first major surface of the substrate.

7. The method of claim 1, wherein the substrate includes through substrate vias which extend from the second major surface to the first major surface of the substrate.

8. The method of claim 1, wherein dispensing the adhesive comprises dispensing the adhesive into a second cavity of the substrate, the method further comprising:
placing a second component having a thickness less than the thickness of the substrate into the second cavity such that the adhesive physically contacts a first major surface of the second component and at least partially fills a gap between sidewalls of the second component and sidewalls of the second cavity, wherein, after placing the second component, a second major surface of the second component is coplanar with the second major surface of the first component and the second major surface of the substrate.

9. The method of claim 8, further comprising:
after placing the first and second components, dispensing additional adhesive over the adhesive in the first cavity to fill a remaining gap between the sidewalls of the first component and the sidewalls of the first cavity and over the adhesive in the second cavity to fill a remaining gap between the sidewalls of the second component and the sidewalls of the second cavity such that a surface of the additional adhesive in the first and second cavities is coplanar with the second major surface of the substrate.

10. The method of claim 1, wherein the thickness of the first component is different from the thickness of the second component.

11. The method of claim 1, wherein an active surface of the first component is at the second major surface of the first component, the method further comprising:
forming an interconnect layer on the second major surface of the substrate and second major surface of the first component.

12. The method of claim 11, further comprising:
singulating the substrate to form a singulated package having the first component; and
attaching a semiconductor device to the first major surface of the substrate of the singulated package, wherein the semiconductor device is one of a packaged device or a surface mount device.

\* \* \* \* \*